(12) United States Patent
Boamfa et al.

(10) Patent No.: US 11,482,510 B2
(45) Date of Patent: Oct. 25, 2022

(54) APPARATUS AND A METHOD OF MANUFACTURING AN APPARATUS

(71) Applicant: KONINKLIJKE PHILIPS N.V., Eindhoven (NL)

(72) Inventors: Marius Iosif Boamfa, Veldhoven (NL); Franciscus Antonius Kneepkens, Waarle (NL); Bastiaan Wilhelmus Maria Moeskops, Uden (NL); Rieko Verhagen, Vught (NL); Jonathan Alambra Palero, Noord-Brabant (NL); Frank Anton Van Abeelen, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 460 days.

(21) Appl. No.: 16/617,018

(22) PCT Filed: Jun. 21, 2018

(86) PCT No.: PCT/EP2018/066502
§ 371 (c)(1),
(2) Date: Nov. 26, 2019

(87) PCT Pub. No.: WO2019/002059
PCT Pub. Date: Jan. 3, 2019

(65) Prior Publication Data
US 2021/0134764 A1    May 6, 2021

(30) Foreign Application Priority Data

Jun. 26, 2017 (EP) .................................. 17177821

(51) Int. Cl.
*H01L 25/075* (2006.01)
*H01L 33/00* (2010.01)
*H01L 33/62* (2010.01)

(52) U.S. Cl.
CPC ........ *H01L 25/0753* (2013.01); *H01L 33/005* (2013.01); *H01L 33/62* (2013.01); *H01L 2933/0066* (2013.01)

(58) Field of Classification Search
CPC ............ H01L 25/0753; H01L 233/005; H01L 233/62; H01L 2933/0066
See application file for complete search history.

(56) References Cited

U.S. PATENT DOCUMENTS

| 6,594,153 B1 | 7/2003 | Zu |
| 2003/0082848 A1 | 5/2003 | Ohuchida |

(Continued)

OTHER PUBLICATIONS

International Search Report and Written Opinion dated Aug. 1, 2018 for International Application No. PCT/EP2018/066502 filed Jun. 21, 2018.

(Continued)

*Primary Examiner* — Kenneth B Lee, Jr.

(57) ABSTRACT

There is provided an apparatus comprising: a base substrate and a component substrate having at least two electronic components arranged thereon. At least one aperture is formed through an entire thickness of the component substrate. The at least one aperture is formed in an interspace between the at least two electronic components. The component substrate is coupled to the base substrate using a solder joint. Each of the at least two electronic components may comprise a light emitting diode element. A method of manufacturing an apparatus is also disclosed.

20 Claims, 3 Drawing Sheets

(56) References Cited

U.S. PATENT DOCUMENTS

| | | |
|---|---|---|
| 2003/0192942 A1 | 10/2003 | Humpston |
| 2006/0247740 A1 | 11/2006 | Roersma |
| 2007/0017699 A1 | 1/2007 | Ishimoto |
| 2009/0210037 A1 | 8/2009 | Roersma |
| 2011/0004201 A1 | 1/2011 | Nuijs |
| 2011/0114989 A1 | 5/2011 | Suehiro |
| 2012/0025258 A1 | 2/2012 | Chan |
| 2013/0175330 A1* | 7/2013 | Arunasalam ....... B23K 35/3612 228/248.1 |
| 2014/0327024 A1* | 11/2014 | Ishihara .................. H01L 33/60 438/27 |
| 2015/0003038 A1* | 1/2015 | Liu .......................... F21K 9/00 438/27 |
| 2019/0067539 A1* | 2/2019 | Kwak ..................... H01L 33/36 |

OTHER PUBLICATIONS https://en.wikipedia.org/wiki/Reflow_soldering.

\* cited by examiner

APPARATUS AND A METHOD OF MANUFACTURING AN APPARATUS

CROSS REFERENCE TO RELATED APPLICATIONS

This application is the U.S. National Phase application under 35 U.S.C. § 371 of International Application No. PCT/EP2018/066502 filed Jun. 21, 2018, published as WO 2019/002059 on Jan. 3, 2019, which claims the benefit of European Patent Application Number 17177821.0 filed Jun. 26, 2017. These applications are hereby incorporated by reference herein.

TECHNICAL FIELD OF THE INVENTION

The invention relates to an apparatus having electronic components and, more particularly, to an apparatus formed using a soldering process. The invention also relates to a method of manufacturing an apparatus having electronic components.

BACKGROUND TO THE INVENTION

Electronic components are used in many fields of technology. Such electronic components are often incorporated into devices and are connected to other electronic components and to a power supply in an electronic system. In some devices, electronic components may be arranged on a printed circuit board (PCB) which mechanically supports and electrically connects the electronic components using electrical connectors (e.g. conductive tracks) formed on the PCB. Electronic components may be connected to the electrical connectors on the PCB using a suitable electrical connection (e.g. a solder joint), or may be mounted or formed onto an intermediate component substrate which may itself be soldered or otherwise mounted onto the PCB.

In some cases, for example cases in which electronic components are mounted on an intermediate component substrate which is soldered to a PCB, a reflow soldering process may be used. Reflow soldering requires the use of a solder paste, which is a mixture of powdered solder and flux. The solder paste is applied between the surfaces to be connected together (e.g. the surfaces of the component substrate and the PCB), so as to temporarily adhere them to one another. The assembly (or the solder paste) is then heated causing the solder to melt, thereby creating a permanent electrical connection between the surfaces to be connected. During the reflow soldering process, volatile solvents in the solder paste are caused to outgas. Gas captured within the solder joint between the surfaces to be connected can cause an imperfect and non-uniform solder joint, which may lead to thermal and electrical implications, affecting the performance of the electronic components and the device within which the apparatus comprising the electronic components is to be installed.

An example of a type of device in which an apparatus comprising electronic components may be incorporated is a personal care device. Personal care devices, such as hair treatment devices (e.g. shavers, trimmers, epilators and photo-epilators), skin treatment devices and oral treatment devices may all include electronic components which are used to treat a portion of a user's body. One particular type of a personal care device, wherein the performance of the device may be affected by imperfect and non-uniform solder joints in the apparatus with the electronic components as mentioned here before, is a photo-epilation device or other kind of skin treatment device which comprises a treatment light source with an array of high-intensity light emitting diodes to generate high-energy light pulses. Imperfect and non-uniform solder joints between the light emitting diodes and the PCB on which the light emitting diodes are mounted may both lead to a reduction of the light intensity produced by the light emitting diodes and a reduction of the heat transfer from the light emitting diodes to the PCB. The reduced light intensity affects the treatment efficiency of the device, and the reduced heat transfer increases the risk of thermal damage to the light emitting diodes.

SUMMARY OF THE INVENTION

As noted above, the creation of gas captured within the solder joint during a process of soldering electronic components to a substrate, or soldering a substrate to a PCB, can lead to a suboptimal electric and thermal connection of the electronic components, thereby affecting the thermal and/or electrical properties of the electronic components.

Therefore, there exists the need for an improved way of connecting electronic components and for a device with an improved connection of its electronic components.

According to a first aspect, the invention provides an apparatus comprising a base substrate and a component substrate having at least two electronic components arranged thereon, wherein at least one aperture is formed through an entire thickness of the component substrate, the at least one aperture formed in an interspace between the at least two electronic components, and wherein the component substrate is coupled to the base substrate using a solder joint.

The at least one aperture formed in the component substrate in the interspace between the at least two electronic components enables an easy outgassing of volatile solvents from the solder paste via the at least one aperture during the soldering process. Because the volatile solvents can easily outgas via the at least one aperture during the soldering process, the capturing of the volatile solvents within the solder joint is prevented or reduced, whereby the uniformity of the solder joint is improved and the thermal and electric connection of the electronic components to the base substrate is improved. Forming the at least one aperture in the component substrate rather than in the base substrate, which may, for example, be a printed circuit board, is advantageous in that no damage will be caused to the PCB and components on the PCB such as conductive tracks, and in that the at least one aperture does not hinder the alignment of the electronic components on the PCB during positioning the electronic components on the PCB in the manufacturing process of the apparatus. Furthermore, the at least one aperture may be formed during the process of manufacturing the component substrate, e.g. during a lithographic deposition process or during a process of dicing the component substrate. In this way, the process of forming the at least one aperture and the apparatus in total may be more cost effective and efficient.

In an embodiment of the apparatus according to the invention, each of the at least two electronic components comprises a light emitting diode element. In particular an array of light emitting diode elements may be provided on the component substrate. In this embodiment the at least one aperture in the component substrate allows to generate a uniform solder joint between the base substrate and the component substrate also in case the component substrate has a relatively large surface area carrying a relatively large number of light emitting diode elements in the array. This results in a uniform light intensity over the array of light emitting diode elements and a uniform heat conduction between the light emitting diode elements and the base substrate over the array of light emitting diode elements. An apparatus having a plurality of light emitting diode elements (LEDs) arranged on the component substrate may be used in a personal care device, such as a photo-epilation device.

In an embodiment of the apparatus according to the invention, the at least one aperture has a width at least equal to the thickness of the component substrate. The at least one aperture may have a width of between 50 micrometres and 300 micrometres. In a particular embodiment of the apparatus according to the invention, the at least one aperture comprises a slit. By selecting the shape, geometry and size of the at least one aperture appropriately, the amount of gas able to outgas and escape from the solder joint during the soldering process can be optimized.

In a particular embodiment of the apparatus according to the invention, the component substrate may comprise a silicon substrate. The silicon substrate may form a common electric connection between the base substrate and the at least two electronic components arranged on the component substrate, for example a common electric connection to ground. The silicon substrate allows the forming of the at least one aperture during a lithographic process for manufacturing the silicon substrate.

In a further embodiment of the apparatus according to the invention, a plurality of apertures are formed through the entire thickness of the component substrate, the plurality of apertures being arranged in at least one substantially straight line in the interspace between the at least two electronic components. By applying a plurality of apertures in the component substrate, the amount of gas able to outgas and escape from the solder joint during the soldering process and, thereby, the uniformity of the solder joint between the component substrate and the base substrate can be increased. Forming the apertures in a straight or substantially straight line may make the aperture forming process simpler and less costly.

In a further embodiment of the apparatus according to the invention, the apparatus comprises an array of component substrates each coupled to the base substrate by means of a solder joint and each having arranged thereon an array of light emitting diode elements, wherein in each component substrate a plurality of apertures is formed through the entire thickness of the component substrate in a plurality of interspaces between the light emitting diode elements. In this embodiment, each component substrate having the array of the light emitting diode elements thereon forms a LED array element, and the array of LED array elements forms a LED array which may be suitable for use as a treatment light source in a photo-epilation device or other type of skin treatment device. In this embodiment each LED array element is electrically and thermally connected to the base substrate by means of an individual solder joint, which has a high uniformity as a result of the plurality of apertures formed through the entire thickness of the component substrate of the LED array element. Thus, the LED array in total provides a uniform light intensity and high efficiency.

According to a second aspect, the invention provides a personal care device comprising a treatment light source having an apparatus according to the invention as described above. The personal care device may be a skin treatment device or a hair treatment device, such as a hair removal device or a hair-growth reducing device, in particular a photo-epilation device.

According to a third aspect, the invention provides a method of manufacturing an apparatus according to the invention, wherein the method comprises the steps of providing a base substrate, providing a component substrate, arranging at least two electronic components on the component substrate, forming at least one aperture through an entire thickness of the component substrate in an interspace between the at least two electronic components, and forming a solder joint between the component substrate and the base substrate.

Manufacturing the apparatus in accordance with the method according to the invention is advantageous, because the forming of the at least one aperture in the component substrate in the interspace between the at least two electronic components enables an easy outgassing of volatile solvents from the solder paste via the at least one aperture during the subsequent step of forming the solder joint between the component substrate and the base substrate. Because the volatile solvents can easily outgas via the at least one aperture during the step of forming the solder joint, the capturing of the volatile solvents within the solder joint is prevented or reduced, whereby the uniformity of the solder joint is improved and the thermal and electric connection of the electronic components to the base substrate is improved. Another advantage of the method according to the invention is that the step of forming the at least one aperture through the entire thickness of a bare component substrate, such as a silicon substrate, is less costly than forming such an aperture in the base substrate, such as a PCB which includes numerous conductive tracks and other components. In addition, the alignment of the component substrate with respect to the base substrate just before the step of forming the solder joint is much more easy when the at least one aperture is formed in the component substrate.

In an embodiment of the method according to the invention, the step of forming the at least one aperture comprises forming the at least one aperture using at least one of a wet plasma etching process, a dry plasma etching process, a laser cutting process, an ultrasound drilling process, a mechanical drilling process, a high-pressure water drilling or cutting process, a sand blasting process, an abrasive waterjet machining process and an electrical discharge machining process.

In a further embodiment of the method according to the invention, the step of forming a solder joint comprises forming a solder joint using a reflow soldering process. A reflow soldering process may be used as volatile solvents, which are typically caused to outgas from the solder paste during the soldering process, are able to escape via the at least one aperture.

In a yet further embodiment of the method according to the invention, the step of forming at least one aperture is performed during a lithographic deposition process, or during a process of dicing the component substrate. By combining the step of forming the at least one aperture with another process involving the manufacturing of the component substrate, manufacturing costs may be kept to a minimum and the efficiency of the manufacturing process may be optimized.

In a further embodiment of the method according to the invention, each of the at least two electronic components comprises a light emitting diode element. In particular an array of light emitting diode elements may be arranged on the component substrate. In this embodiment the at least one aperture in the component substrate allows to generate a uniform solder joint between the base substrate and the component substrate also in case the component substrate has a relatively large surface area carrying a relatively large number of light emitting diode elements in the array. This results in a uniform light intensity over the array of light emitting diode elements and a uniform heat conduction between the light emitting diode elements and the base substrate over the array of light emitting diode elements.

Other features of the invention will become apparent from the following description of preferred embodiments of the apparatus and method according to the invention.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE PREFERRED EMBODIMENTS

As noted above, during some soldering processes, gas may be generated in the solder material, and this gas can be enclosed in the solder joint and thus cause the solder joint to be formed non-uniformly, leading to suboptimal functioning of the electronic components electrically connected by the solder joint and the device within which the electronic components are installed. When electronic components having a relatively small footprint (i.e. a relatively small contact area to be soldered) are soldered to a substrate, gas formed during the soldering process may be able to escape around the sides of the electronic components. However, if a soldering process is used to connect relatively larger electronic components, or used to connect a component substrate having electronic components arranged thereon, then part of the gas may not be able to escape around the sides of the electronic components or the component substrate and may therefore become trapped in the solder joint. Therefore, the inventors have proposed a method by which the soldering process may be performed without gas or with only a minimum amount of gas becoming trapped in the solder joint between the surfaces being soldered.

While the present invention may be applied to a wide range of technologies, one exemplary field of technology discussed herein, in which the invention may be applied, is the field of personal care devices. Specifically, the invention may find applications in the field of hair removal or hair-growth reduction devices, for example intense pulsed light (IPL) devices, also known as photo-epilators, or other types of skin treatment devices having a treatment light source. While known photo-epilators use high-intensity light sources, such as xenon flash bulbs, to create high-intensity pulses of light to treat hairs, it has been proposed to generate treatment light pulses using light emitting diodes (LEDs). In such an arrangement, a plurality of LED elements may be arranged in an array, for example on a substrate (referred to herein as a component substrate or LED array substrate), which is then attached to a base substrate, such as a printed circuit board (PCB), using a solder joint. The component substrate on which the array of LED elements is arranged may be relatively large compared to the individual LED elements arranged thereon. Therefore, gas formed in the solder material during the process of forming the solder joint between the component substrate and the base substrate may become trapped in the solder joint.

Figure 1:
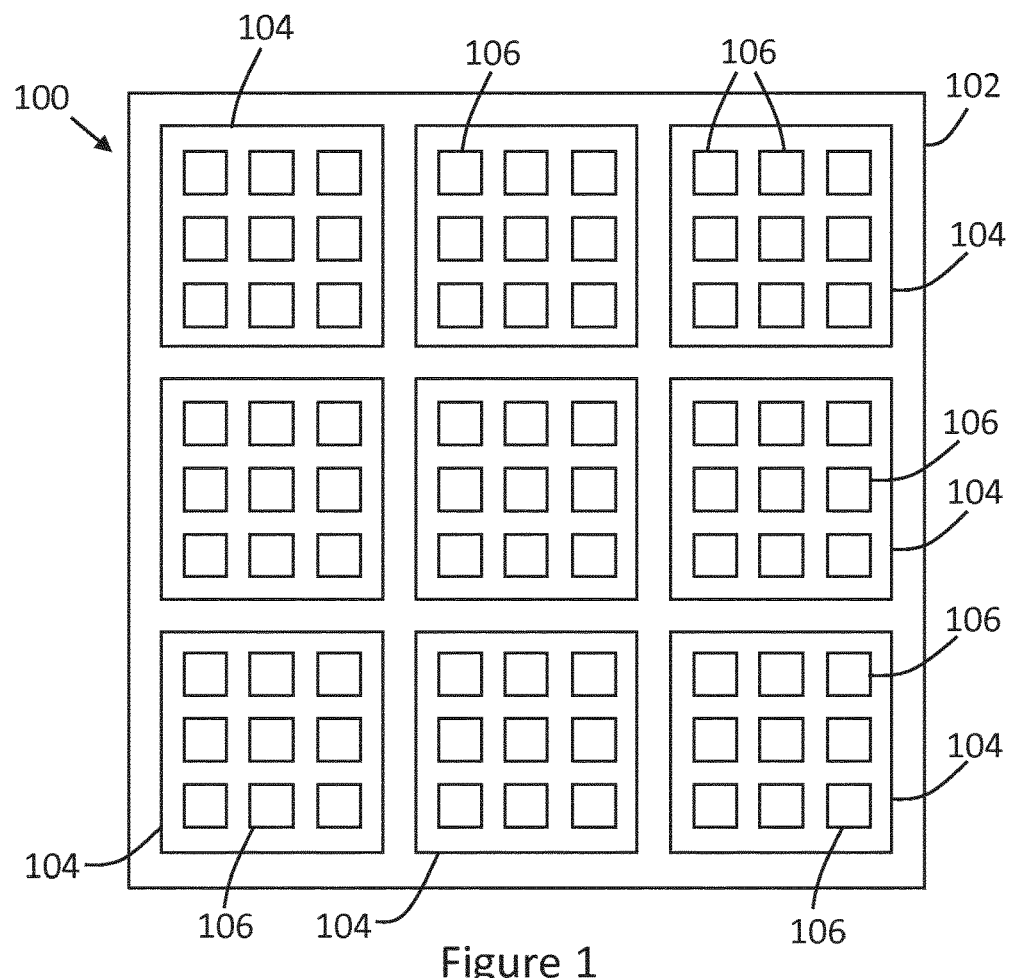
FIG. 1 is a schematic illustration of an example of an apparatus according to the invention having a plurality of component substrates, each having electronic components arranged thereon and connected to a base substrate.

Referring to the drawings, FIG. 1 shows a schematic illustration of an apparatus 100 according to the invention. The apparatus 100 may be an apparatus, in particular a treatment light source, for use in a device, such as a personal care device. The apparatus 100 includes a base substrate 102 which, in this example, is a printed circuit board (PCB). A plurality of component substrates 104 are each attached to the base substrate 102 using a solder joint. For example, each component substrate 104 may be attached to the base substrate 102 by means of an individual solder joint formed by means of a reflow soldering process. In this example, each component substrate 104 has an array of electronic components 106 arranged thereon, which may be attached to or formed on the component substrate 104 as discussed below. The combination of a component substrate 104 and an array of electronic components 106 arranged thereon may be referred to as a "component array element". In the example shown in FIG. 1, each electronic component 106 comprises a light emitting diode (LED) element, such as a LED tile, such that the component array element constitutes an "LED array element". In the example shown, nine component substrates 104 are attached to the base substrate 102, and each component substrate 104 has nine electronic components (e.g. LED tiles) 106 arranged thereon. It will be appreciated that the shape of the base substrate 102, the number and arrangement of the component substrates 104 and the number and arrangement of the electronic components 106 on each of the component substrates 104 may differ from those shown in the example of FIG. 1. Similarly, while the electronic components 106 of this example comprise LED tiles 106, in other examples of the invention the electronic components 106 may be of any other type.

In some examples, the electronic components 106 may be formed on the component substrate 104 as part of a process in which material is lithographically deposited onto the component substrate 104. This way of forming the electronic components 106 on the component substrate 104 may be particularly used in the example of FIG. 1 comprising the LED elements. In other examples, the electronic components 106 may be formed on the component substrate 104, or otherwise connected to, mounted on, attached to or arranged on the component substrate 104 using other known techniques.

The component substrate 104 may be formed from any suitable material. For example, the component substrate 104 may be formed from silicon. Each electronic component 106 arranged on the component substrate 104 may be individually addressed by a separate electrical connection, for example by a gold wire, not shown in the figures. All of the electronic components 106 on a component substrate 104 may share a common electrical ground connection, in the example of FIG. 1 by means of the component substrate 104.

Figure 2:
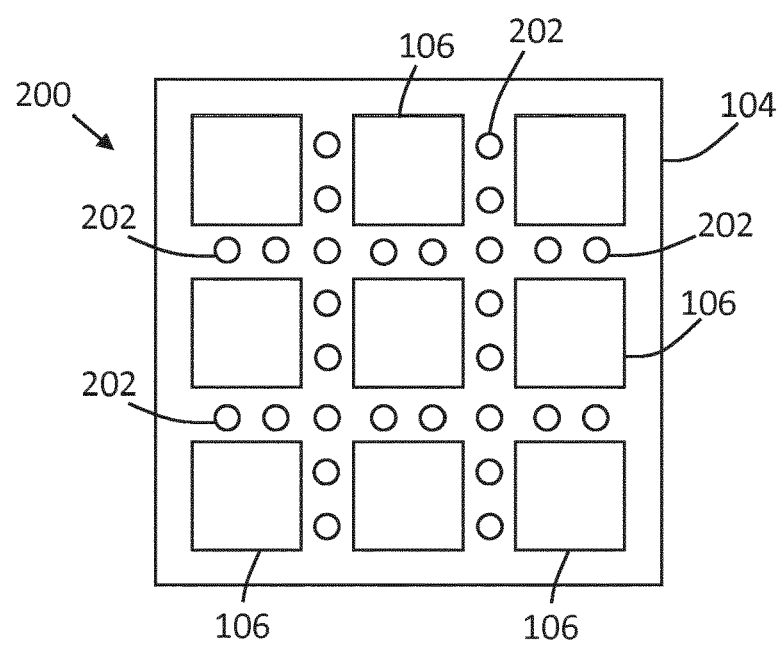
FIG. 2 is a schematic illustration of an example of one of the component substrates, having electronic components arranged thereon, of the apparatus of FIG. 1.

FIG. 2 shows a schematic illustration of one component array element 200 (i.e. a component substrate 104 having an array of electronic components 106 arranged thereon) of the apparatus 100 shown in FIG. 1. The component substrate 104 in FIG. 2 has a plurality of apertures 202 formed there-through. The apertures are not shown in FIG. 1, for clarity. The apertures 202 are through-holes, which form a passage from one main side of the component substrate 104 to the opposite main side, as is shown clearly in FIG. 3. In other words, the apertures 202 extend through the entire thickness t of the component substrate 104. While, in the example of FIG. 2, the component substrate 104 includes twenty eight apertures formed through it, the number of apertures formed in other examples may be larger or smaller. For example, only a single aperture may be formed through the component substrate 104.

The apertures 202 are formed in an interspace between the electronic components 106. That is to say, the apertures 202 are formed through the component substrate 104 in regions between the electronic components 106. In this way, the apertures 202 are formed in regions of the component substrate 104 that are not occupied by the electronic components 106 and, therefore, the positions of the apertures 202 do not adversely affect the functionality of the electronic components 106. The apertures 202 do not need to be arranged centrally in the interspace between the electronic components 106, as is the case in the example shown in FIG. 2. In some examples, the apertures 202 may be positioned closer to a particular electronic component 106 than to an adjacent electronic component.

In the example shown, the apertures 202 are formed in straight or substantially straight lines between the electronic components 106. Forming the apertures in this arrangement may provide benefits in terms of manufacturing efficiencies. It will be appreciated, however, that the apertures 202 may alternatively be arranged in some other manner.

Figure 3:
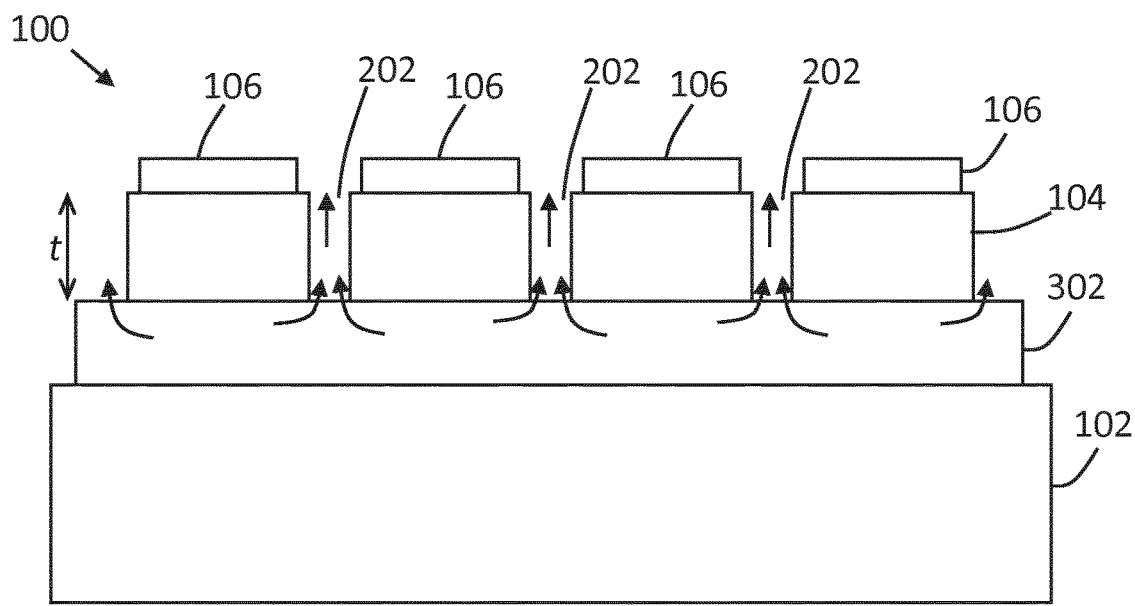
FIG. 3 is a schematic illustration of an example of an apparatus according to the invention having a component substrate connected to a base substrate and having electronic components arranged thereon.

FIG. 3 shows a sectional view of a portion of the apparatus 100 of FIG. 1. The apparatus 100 shown in FIG. 3 comprises the base substrate 102 and the component substrate 104. The component substrate 104 has at least two electronic components 106 arranged thereon. At least one aperture 202 is formed through an entire thickness of the component substrate. In the example shown in FIG. 3, the component substrate has a thickness t. The at least one aperture 202 is formed in an interspace between the at least two electronic components 106. The component substrate 104 is coupled to the base substrate 102 by means of a solder joint 302.

By forming the apertures 202 in the component substrate 104 at the location of the interspaces between the electronic components 106, the apertures 202 can be accurately positioned to ensure that they do not interfere with, or adversely affect, thermal or electrical aspects of the electronic components 106. A further advantage of creating the apertures 202 in the component substrate 104 rather than, for example, in the base substrate 102 is that the electrical connectivity between the component substrate 104 and the base substrate 102 is not adversely affected. Further, since the apertures 202 are formed in the component substrate 104 rather than, for example, in the base substrate (e.g. the PCB) 102, the apertures 202 may be created early in the manufacturing process, for example while the individual component substrates 104 are diced (i.e. cut) from a larger wafer. By combining the process of creating the apertures 202 in the component substrate 104 with the process of manufacturing the component substrate 104, e.g. dicing it from a wafer, the total manufacturing process of the apparatus 100 is simplified and manufacturing costs are reduced.

As noted above, when a soldering process, such as a reflow soldering process, is used to attach the component substrate 104 to the base substrate 102, outgassing of volatile solvents in the solder material may occur during the soldering process for forming the solder joint 302. The apertures 202 through the component substrate 104 provide a route via which such volatile solvents outgassing from the solder material may escape from the solder joint 302 during the soldering process. In this way, the amount of gas that becomes trapped in the solder joint 302 between the component substrate 104 and the base substrate 102 is reduced, and the uniformity of the solder joint 302 is not affected (i.e. reduced) or affected only to a minimum amount. In FIG. 3, arrows indicate possible directions in which the gas may flow and escape from the solder joint 302 during the soldering process.

The at least one aperture 202 may, in some embodiments, be formed as large as possible such that the at least one aperture 202 is able to fit in the interspace between the at least two electronic components 106. This improves the likelihood that gas created in the solder joint 302 during the soldering process is able to escape via the aperture 202. In some embodiments, the at least one aperture 202 has a width at least equal to the thickness t of the component substrate 104. Again, this improves the likelihood that gas is able to escape during the soldering process, but ensures that the structural integrity of the component substrate 104 is maintained. It will of course be appreciated that, in embodiments in which the interspace between the at least two electronic components 106 is relatively large, the width of the apertures 202 may be relatively large, while in embodiments in which the interspace between the at least two electronic components 106 is relatively small, the width of the apertures 202 may be relatively small. In some embodiments, the at least one aperture 202 may have a width of between 50 micrometres and 300 micrometres. The width of the at least one aperture 202 may, in some embodiments, be between 50 micrometres and 200 micrometres or, more preferably, between 50 micrometres and 100 micrometres. Thus, the component substrate 104 may have a corresponding thickness of between 50 micrometres and 300 micrometres, or more preferably between 50 micrometres and 200 micrometres, or even more preferably between 50 micrometres and 100 micrometres.

The apertures 202 may be of any suitable shape. For ease of manufacture, the at least one aperture 202 may comprise a substantially circular cross-section. In this embodiment, a substantially cylindrically-shaped through-hole may be formed through the component substrate 104. In some embodiments, the at least one aperture 202 may comprises a slit. Creating the at least one aperture 202 in the form of a slit may be advantageous, as compared to a circular aperture, in that there is a larger region via which gas is able to escape from the solder joint 302 during the soldering process.

As noted above, the component substrate 104 may comprise a silicon substrate. It is known that a relatively thin silicon substrate may be particularly fragile and vulnerable to damage. Therefore, silicon substrates are often packaged to form an integrated circuit package, which may be stronger and more durable and, therefore, easier to handle without causing damage to the silicon substrate or to the components attached thereto. Once packaged, it is difficult to create apertures in the component substrate (i.e. the silicon substrate). In the present invention, however, the component substrate 104 is a bare, unpackaged substrate and, therefore, it is possible to create apertures 202 in the component substrate 104, and it is not necessary to attempt to form the apertures 202 in the base substrate 102.

In some embodiments, such as the embodiments shown in the drawings, a plurality of apertures 202 may be formed through the entire thickness of the component substrate 104. As noted above, the plurality of apertures 202 may be arranged in at least one straight or substantially straight line. In some embodiments, in which a plurality of apertures 202 is formed through the component substrate 104, the apertures 202 may have different shapes and/or sizes. For example, one or more of a plurality of apertures 202 may be circular, while one or more of the plurality of apertures may be formed as slits. The selection of the size and/or shape of the apertures 202 to be formed at a particular location in a component substrate 104 may be based on the nature (e.g. the size, shape and number) of the electronic components 106 on the component substrate 104, or to be formed or mounted on the component substrate 104.

The apparatus 100 discussed above may be implemented in numerous ways. According to an aspect of the invention, the apparatus 100 may be incorporated into a personal care device, such as the personal care device 400 shown in FIG. 4. The personal care device 400 is a photo-epilator, which emits high-intensity pulsed light at a region of the skin of a user to reduce or prevent growth of hairs from that region of the skin. It will be appreciated, however, that the apparatus 100 may be incorporated into other types of personal care devices.

Figure 4:
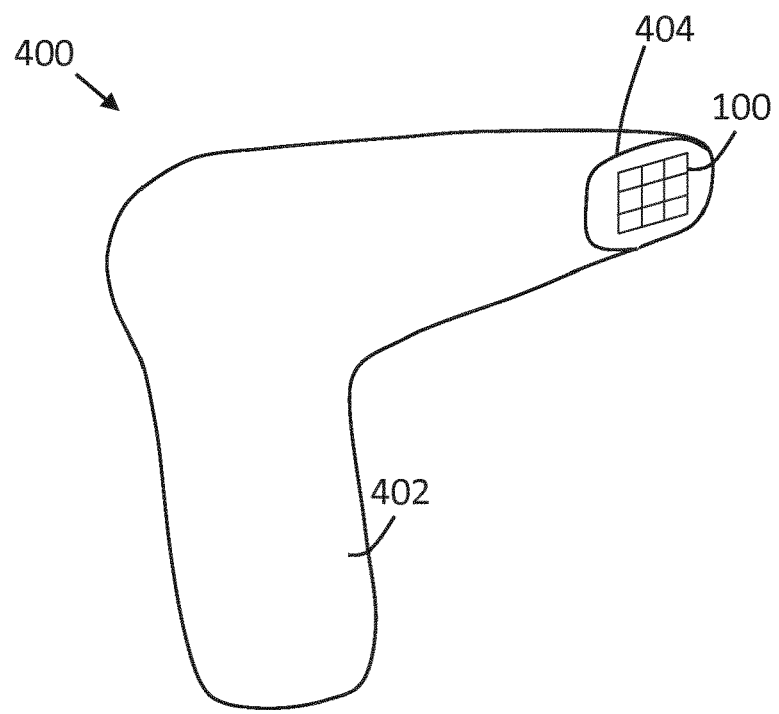
FIG. 4 is an illustration of an example of a personal care device according to the invention.

The personal care device 400 comprises a treatment light source 404, which is only schematically shown in FIG. 4. The treatment light source 404 comprises the apparatus 100 comprising the array of LED array elements, as discussed above and shown in FIGS. 1 and 3. In particular, as shown in FIGS. 1, 2 and 3, the treatment light source 404 comprises an array of component substrates 104 each connected to the base substrate 102 by means of a solder joint 302 and each having arranged thereon an array of electronic components 106 in the form of light emitting diode elements (or LED tiles), wherein in each component substrate 104 a plurality of apertures 202 is formed through the entire thickness of the component substrate 104 in a plurality of interspaces between the light emitting diode elements. The personal care device 400 may, in some embodiments, be a hair treatment device to reduce or prevent the growth of hairs. In some embodiments, the personal care device 400 may further comprise a handle portion 402, or a housing sized suitably to be held by a user. The personal care device 400 may of course include other features and components, not shown in FIG. 4. For example, the personal care device may comprise a housing assembly which contains other components of the device. The housing assembly may comprise the handle portion 402. The housing assembly may house the apparatus 100, or the apparatus 100 may be assembled to the housing assembly in a manner which will be familiar to those skilled in the art. In use, a user may hold the handle portion 402 with his or her hand, such that the portion of the skin to be treated is exposed to the treatment light source 404.

Figure 5:
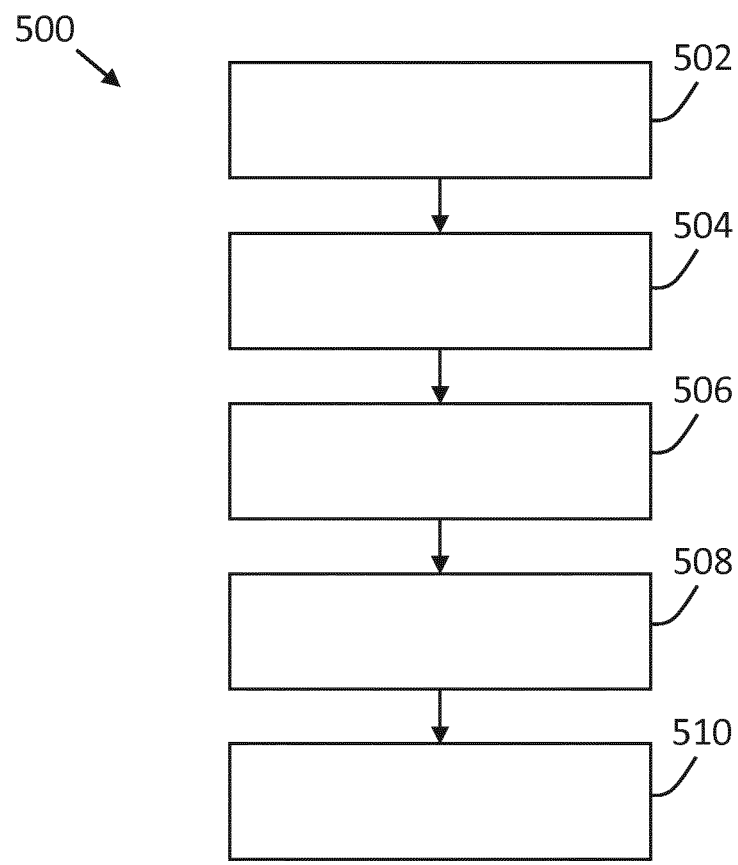
FIG. 5 is a flowchart of an example of a method according to the invention of manufacturing an apparatus according to the invention, such as the apparatus of FIG. 3.

Another aspect of the invention relates to a method of manufacturing an apparatus according to the invention, such as the apparatus 100. FIG. 5 is a flowchart of an example of a method 500 according to the invention of manufacturing the apparatus 100. The method 500 comprises, at step 502, providing a base substrate 102. The base substrate may, for example, comprise a PCB. At step 504, the method 500 comprises providing a component substrate 104. In some examples, the component substrate 104 may comprise a silicon substrate. The method 500 comprises, at step 506, arranging at least two electronic components 106 on the component substrate 104. The electronic components 106 may, in some examples, be formed or built on the component substrate 104. At step 508, the method comprises forming at least one aperture 202 through an entire thickness of the component substrate 104 in an interspace between the at least two electronic components 106. The method 500 comprises, at step 510, forming a solder joint 302 between the component substrate 104 and the base substrate 102. While the steps 502 to 510 are presented in a particular order in FIG. 5, it will be apparent that the steps of the method 500 may be performed in a different order. For example, the step of forming at least one aperture (step 508) may be performed prior to the step of arranging at least two electronic components on the component substrate (step 506).

In some embodiments of the method according to the invention, at step 510 the solder joint may be formed using a reflow soldering process, as outlined above.

Each of the at least two electronic components 106 may, in some embodiments, comprise a light emitting diode (LED) element.

The at least one aperture may be formed (step 508) in a number or ways. In some embodiments, the at least one aperture may be formed using at least one of a wet plasma etching process, a dry plasma etching process, a laser cutting process, an ultrasound drilling process, a mechanical drilling process, a high-pressure water drilling or cutting process, a sand basting process, an abrasive waterjet machining process and an electrical discharge machining process. Other suitable methods of creating apertures 202 through the component substrate 104 may also be used, and such methods will be familiar to those skilled in the art.

The step 508 of forming at least one aperture 202 may be performed during a lithographic deposition process, or during a process of dicing the component substrate 104. In other words, the at least one aperture 202 may be formed while material is being lithographically deposited onto the component substrate 104. In this way, the apertures 202 may be formed in a process which also forms other features of the component substrate 104 or components on the component substrate 104, which simplifies the manufacturing process of the component substrate 104. Further, by forming the apertures 202 by means of such a lithographic deposition process, it may be easier to handle and manipulate the component substrate 104, as the lithographic deposition process is performed before the component substrate 104 is attached to the base substrate 102. Thus, there is a lower risk of damage being caused to any other elements of the apparatus 100.

Figure 6:
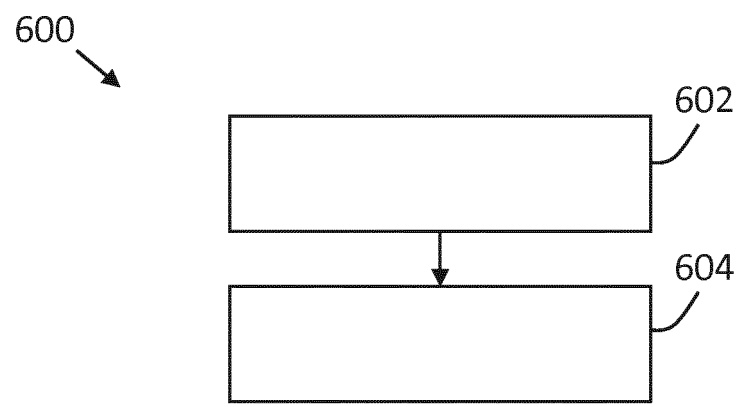
FIG. 6 is a flowchart of an example of a method of manufacturing a personal care device according to the invention, such as the personal care device of FIG. 4.

A further aspect of the invention relates to a method of manufacturing a personal care device according to the invention. FIG. 6 is a flowchart of an example of a method 600 of manufacturing a personal care device, such as the personal care device 400 shown in FIG. 4. The method 600 comprises, at step 602, manufacturing an apparatus 100 according to the method 500 discussed above. At step 604, the method 600 comprises assembling the apparatus 100 to a housing assembly of the personal care device 400.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. An apparatus comprising:
 a base substrate; and
 a component substrate having at least two electronic components arranged thereon;
  wherein at least one aperture is formed through an entire thickness of the component substrate, the at least one aperture formed in an interspace between the at least two electronic components; and
  wherein the component substrate is coupled to the base substrate using a solder joint.

2. The apparatus according to claim 1, wherein each of the at least two electronic components comprise a light emitting diode element.

3. The apparatus according to claim 1, wherein the at least one aperture has a width at least equal to the thickness of the component substrate.

4. The apparatus according to claim 1, wherein the at least one aperture has a width of between 50 micrometres and 300 micrometres.

5. The apparatus according to claim 1, wherein the at least one aperture comprises a slit.

6. The apparatus according to claim 1, wherein the component substrate comprises a silicon substrate.

7. The apparatus according to claim 1, wherein a plurality of apertures are formed through the entire thickness of the component substrate, the plurality of apertures being arranged in at least one straight line in the interspace between the at least two electronic components.

8. The apparatus according to claim 2, comprising an array of component substrates each coupled to the base substrate by means of a solder joint and each component substrate having arranged thereon an array of light emitting diode elements, wherein in each component substrate, a plurality of apertures is formed through the entire thickness of the component substrate in a plurality of interspaces between the array of light emitting diode elements.

9. A personal care device comprising a treatment light source having an apparatus according to claim 1.

10. The personal care device according to claim 9, wherein the personal care device is a skin treatment device.

11. A method of manufacturing an apparatus according to any of the preceding claims, the method comprising the steps of:
 providing a base substrate;
 providing a component substrate;
 arranging at least two electronic components on the component substrate;
 forming at least one aperture through an entire thickness of the component substrate in an interspace between the at least two electronic components; and
 forming a solder joint between the component substrate and the base substrate.

12. The method according to claim 11, wherein the step of forming the at least one aperture comprises forming the at least one aperture using at least one of a wet plasma etching process, a dry plasma etching process, a laser cutting process, an ultrasound drilling process, a mechanical drilling process, a high-pressure water drilling or cutting process, a sand blasting process, an abrasive waterjet machining process and an electrical discharge machining process.

13. The method according to claim 11, wherein the step of forming a solder joint comprises forming a solder joint using a reflow soldering process.

14. The method according to claim 11, wherein the step of forming at least one aperture is performed during a lithographic deposition process.

15. The method according to claim 11, wherein each of the at least two electronic components comprises a light emitting diode element.

16. The method according to claim 11, wherein the step of forming at least one aperture is performed during a process of dicing the component substrate.

17. The personal care device according to claim 9, wherein the personal care device is a hair treatment device.

18. An apparatus comprising:
 a base substrate; and
 an array of component substrates, each coupled to the base substrate by means of a solder joint,
 wherein in each component substrate an array of light emitting diode elements is arranged thereon;
 wherein in each component substrate, a plurality of apertures are formed through an entire thickness of the component substrate in a plurality of interspaces between the light emitting diode elements.

19. The apparatus according to claim 18, each component substrate forms an LED array element and the plurality of LED array elements forms an LED array suitable for use as a treatment light source in a photo-epilation device.

20. The apparatus according to claim 19, wherein each LED array element is electrically and thermally connected to the base substrate by means of an individual solder joint.

* * * * *